US009852979B2

(12) United States Patent
Romig et al.

(10) Patent No.: US 9,852,979 B2
(45) Date of Patent: Dec. 26, 2017

(54) CONDUCTIVE THROUGH-POLYMER VIAS FOR CAPACITATIVE STRUCTURES INTEGRATED WITH PACKAGED SEMICONDUCTOR CHIPS

(71) Applicant: Texas Instruments Incorporated, Dallas, TX (US)

(72) Inventors: Matthew D. Romig, Wylie, TX (US); Frank Stepniak, Allen, TX (US); Saumya Gandhi, Lewisville, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/339,550

(22) Filed: Oct. 31, 2016

(65) Prior Publication Data

US 2017/0047283 A1    Feb. 16, 2017

Related U.S. Application Data

(62) Division of application No. 14/668,085, filed on Mar. 25, 2015, now Pat. No. 9,572,261.

(51) Int. Cl.
*H01L 23/522* (2006.01)
*H01L 21/768* (2006.01)
(Continued)

(52) U.S. Cl.
CPC ........ *H01L 23/5223* (2013.01); *H01L 21/288* (2013.01); *H01L 21/31051* (2013.01); *H01L 21/76805* (2013.01); *H01L 21/76831* (2013.01); *H01L 21/76874* (2013.01); *H01L 21/76877* (2013.01); *H01L 21/78* (2013.01);
(Continued)

(58) Field of Classification Search
CPC .................................................... H01L 21/288
See application file for complete search history.

(56) References Cited

U.S. PATENT DOCUMENTS 5,825,628 A    10/1998    Garbelli et al.
6,211,542 B1    4/2001    Eastep et al.
(Continued)

FOREIGN PATENT DOCUMENTS

JP    2009188219    8/2009
WO    2008/139392    11/2008

*Primary Examiner* — Seahvosh Nikmanesh
(74) *Attorney, Agent, or Firm* — Jacqueline J. Garner; Charles A. Brill; Frank D. Cimino

(57) ABSTRACT

An electronic system comprising an electronic body (301) with terminal pads (310) and at least one capacitor embedded in the electronic body. The capacitor including an insulating and adhesive first polymeric film (302) covering the body surface except the terminal pads; a sheet (320) of high-density capacitive elements, the first capacitor terminal being a metal foil (321) attached to film (302), the second terminal a conductive polymeric compound (324), and the insulator a dielectric skin (323). Sheet (320) has sets of via holes: the first set holes reaching metal foil 321), the second set holes reaching the terminals (310), and the third set holes reaching the conductive polymeric compound (324). An insulating second polymeric film (303) lining the sidewalls of the holes and planarizing the sheet surface; and metal (432) filling the via holes between the polymeric sidewalls and forming conductive traces and attachment pads on the system surface.

13 Claims, 11 Drawing Sheets

(51) Int. Cl.
*H01L 23/528* (2006.01)
*H01L 21/288* (2006.01)
*H01L 21/78* (2006.01)
*H01L 29/02* (2006.01)
*H01L 21/3105* (2006.01)
*H05K 1/18* (2006.01)
*H05K 1/11* (2006.01)
*H05K 1/16* (2006.01)
*H01L 49/02* (2006.01)
*H01L 23/00* (2006.01)

(52) U.S. Cl.
CPC ........ *H01L 23/528* (2013.01); *H01L 23/5226* (2013.01); *H01L 28/60* (2013.01); *H05K 1/113* (2013.01); *H05K 1/162* (2013.01); *H05K 1/181* (2013.01); *H05K 1/185* (2013.01); *H01L 24/14* (2013.01); *H01L 2924/19011* (2013.01); *H01L 2924/19041* (2013.01); *H01L 2924/19042* (2013.01); *H01L 2924/19104* (2013.01); *H05K 2201/0187* (2013.01); *H05K 2201/0215* (2013.01); *H05K 2201/10734* (2013.01)

(56) References Cited

U.S. PATENT DOCUMENTS

| | | |
|---|---|---|
| 6,388,207 B1 | 5/2002 | Figueroa et al. |
| 8,084,841 B2 | 12/2011 | Pulugurtha et al. |
| 8,174,017 B2 | 5/2012 | Pulugurtha et al. |
| 8,432,033 B2 | 4/2013 | Shinohara |
| 9,572,261 B2 * | 2/2017 | Romig .................. H05K 1/185 |
| 2008/0257589 A1 | 10/2008 | Ostmann et al. |

* cited by examiner

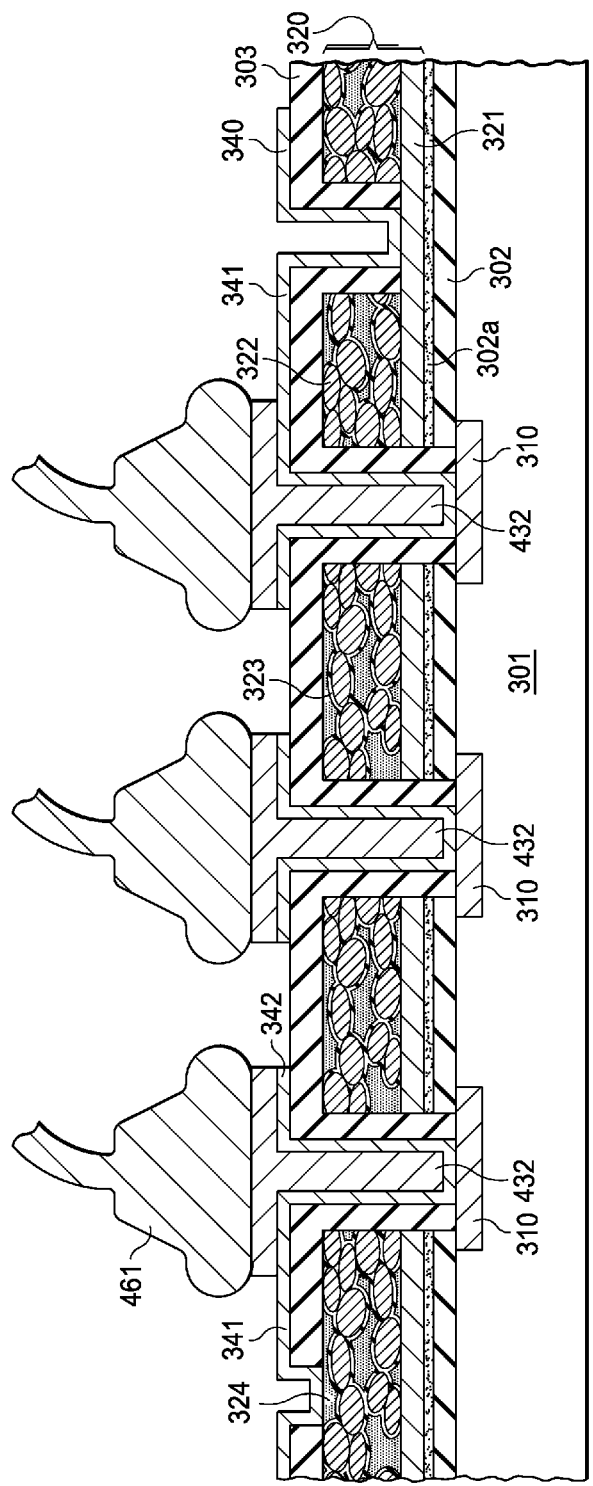
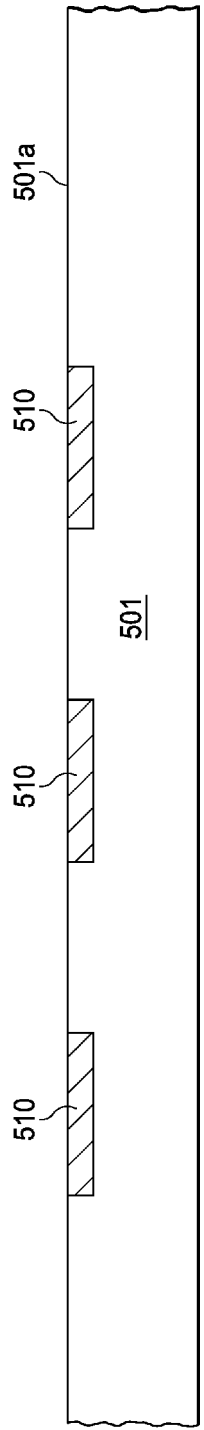
FIG. 4B
FIG. 5A

CONDUCTIVE THROUGH-POLYMER VIAS FOR CAPACITATIVE STRUCTURES INTEGRATED WITH PACKAGED SEMICONDUCTOR CHIPS

This application is divisional of U.S. patent application Ser. No. 14/668,085, filed Mar. 25, 2015, now U.S. Pat. No. 9,572,261, the entirety of which is incorporated herein by reference.

FIELD

Embodiments of the invention are related in general to the field of semiconductor devices and processes, and more specifically to the structure and fabrication method of electronic systems encapsulated in a package with embedded nanometer-sized three-dimensional capacitors.

DESCRIPTION OF RELATED ART

Among the popular families of power supply circuits are the power switching devices for converting one DC voltage to another DC voltage, the DC/DC converters. Particularly suitable for the emerging power delivery requirements are the Power Blocks with two power MOS field effect transistors (FETs) connected in series and coupled together by a common switch node; such assembly is also called a half bridge. When a regulating driver and controller is added, the assembly is referred to as Power Stage or, more commonly, as Synchronous Buck Converter or Voltage Regulator. In the synchronous Buck converter, the control FET chip, also called the high-side switch, is connected between the supply voltage $V_{IN}$ and the $LC_{OUT}$ output filter, and the synchronous (sync) FET chip, also called the low side switch, is connected between the $LC_{OUT}$ output filter and ground potential. The gates of the control FET chip and the sync FET chip are connected to a semiconductor chip including the circuitry for the driver of the converter and the controller.

For many of today's power switching devices, the chips of the power MOSFETs and the driver and controller IC are assembled as individual components. The chips are typically attached to a rectangular or square-shaped pad of a metallic leadframe; the pad is surrounded by leads as output terminals. This approach consumes area and increases the footprint of the module. In another recently introduced scheme, the control FET chip and the sync FET chip are assembled vertically on top of the other as a stack. In this assembly, at least one MOSFET chip is configured for vertical current flow; the source electrode of the control FET chip is facing the drain electrode of the sync FET chip.

Among the components of electronic systems assembled on printed circuit boards are typically capacitors of various sizes. To save board space and reduce parasitics, these capacitors are often placed as piece parts in tight proximity to other board components such as transistors and inductors. Driven by the relentless trend to conserve board real estate and minimize parasitic electrical effects, these capacitors are sometimes placed under or on top of other components.

As an examples of an additional step to advance conservation, stacked chip power MOSFETs have recently been proposed, which integrate a capacitor into the package of the device. To increase the obtainable value of capacitance per area by at least one order of magnitude, capacitors have recently been demonstrated based on the concept of folding the third dimension into the area of two dimensions: Cavities are etched into metal boards made for instance of aluminum; the aluminum surface in the cavities is then oxidized, and the cavities are filled with a conductive material such as a polymeric compound. After applying contacts to the metal board and the conductive compound, the three-dimensional structure can be operated as a capacitor offering high capacitance values.

SUMMARY

Analyzing the challenges for providing miniature capacitors with high capacitance values to semiconductor chips and electronic systems of ever shrinking geometrical dimensions, applicants realized that these capacitors are most effective when they are thin film capacitors, integrated into the conductive network interconnecting the circuit elements, and in close proximity to active circuitry. For devices needing a package for protecting bonding wires, the capacitors may be fully integrated into the package. For devices which can be solder-assembled without housing, the capacitors may be fully integrated into the semiconductor chip.

Applicants further realized that the integration into conductive networks requires conductive vias of controlled depth through insulating materials so that the capacitors can be connected to each conductive level of a multi-level laminated network.

Applicants solved the problem of conductive vias through insulating polymers when they discovered a methodology to create concurrently polymeric bonds to metals, refractory metals, conductive polymers, and inorganic insulators. The methodology accepts pre-fabricated sheets of high density nano-capacitors, attaches the sheets to semiconductor wafers, fabricates the interconnections between capacitors and chip circuitry at various levels of a multi-level laminate, and, if needed, forms the packages for the plurality of devices before singulating the devices from the wafer.

The conductive through-polymer-vias of the invention are distinguished by the absence of a problem of mismatched coefficients of thermal expansion (which is known to plague through-silicon-vias), avoiding device failures due to delamination and temperature cycling.

The methodology is flexible and applicable to diverse devices with a single semiconductor chip, as well as to devices such as power supply systems with multiple chips. Due to the capacitors combining high capacitance density, high operating frequency, and miniscule size, the semiconductor devices may have small overall sizes in the low millimeter range; they further demonstrate stability of capacitance and frequency, and exhibit high reliability in high and low temperatures and in temperature swings.

For the preferred application to power supply systems, it is a technical advantage that the new methodology reduces electrical parasitics by placing the input capacitor in close proximity to the active circuitry. The reduced parasitic inductance allows an increase of switching frequency, which in turn allows a shrinkage of the bulky output inductor.

It is another technical advantage that the preferred process flow enables concurrent lithography through a plurality of consecutively applied polymeric compounds and a concurrent curing process of the polymers.

BRIEF DESCRIPTION OF THE DRAWINGS

FIG. 4B illustrates a cross section of a portion of an exemplary embodiment, a semiconductor body integral with high-density capacitive structures and conductive through-polymer vias connecting body terminal pads to surface contact pads having wire ball bond connectors.

FIG. 5A depicts the process of providing a semiconductor wafer with embedded circuitry and circuitry contact pads on a wafer side.

DETAILED DESCRIPTION OF PREFERRED EMBODIMENTS

Figure 1:
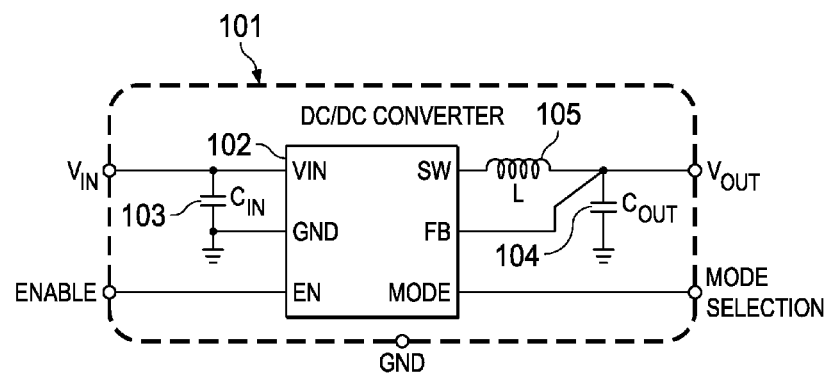
FIG. 1 shows a circuit diagram of a power supply system including DC/DC converter, capacitors and inductor.
Figure 2:
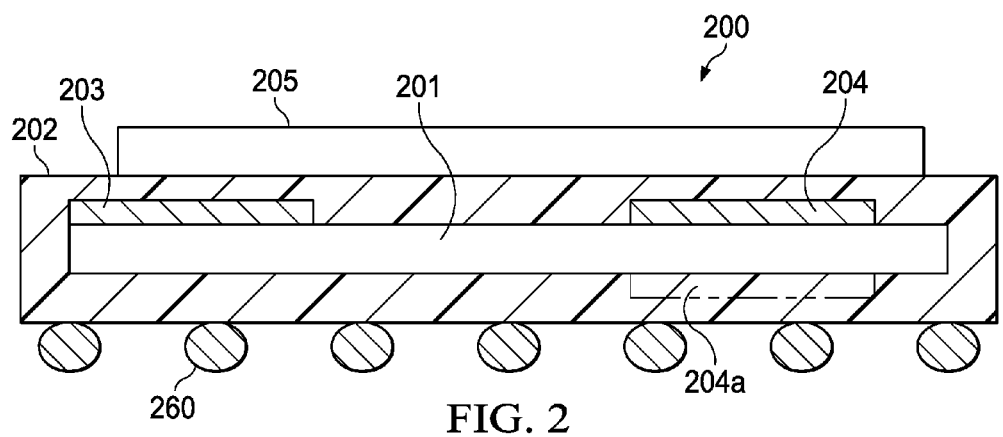
FIG. 2 illustrates a simplified cross section of a power supply system with capacitors integrated into a packaged semiconductor body according to the invention.

In the circuit diagram of FIG. 1, the power supply, exemplified by the dashed outline 101, includes DC/DC converter 102, input capacitor $C_{IN}$ (103), output capacitor $C_{OUT}$ (104), and inductor L (105). FIG. 2 illustrates an actualization of a power supply as an exemplary silicon-in-package device 200 for board attachment with solder balls 260. Device 200 is based on an embodiment of the invention. Device 200 includes semiconductor body 201 in a package 202, input capacitor $C_{IN}$ (203), output capacitor $C_{OUT}$ (204), and inductor L (205). Semiconductor body may be a single silicon chip, or an assembly of more than one chip. It should be stressed that more generally, body 201 may be an electronic body, which may include an assembly of one or more semiconductor chips, or generally may include electronic circuitry.

As the power supply of FIG. 2 shows, both capacitors are embedded with semiconductor body 201, while the inductor 205, serving as the energy storage of the power supply circuit, is a large enough discrete component (typical sizes are 300 to 400 nH) to reliably function as the maintainer of a constant output voltage $V_{OUT}$. In other embodiments, the capacitors may be embedded so that the output capacitor 204a is on the backside of body 201, or the input capacitor is positioned in a gap between the inductor and the package.

By embedding the capacitors with the semiconductor body, the physical dimensions of the power supply device can be reduced significantly. As an example, while a device with conventional discrete capacitors and inductor may require device dimensions of length 2.9 mm, width 2.3 mm, and height 1 mm (including the discrete components), the same device with embedded capacitors achieves dimensions of length 2.0 mm, width<1.5 mm (for instance 1,0 mm), and height 1 mm (including a discrete inductor).

Figure 3:
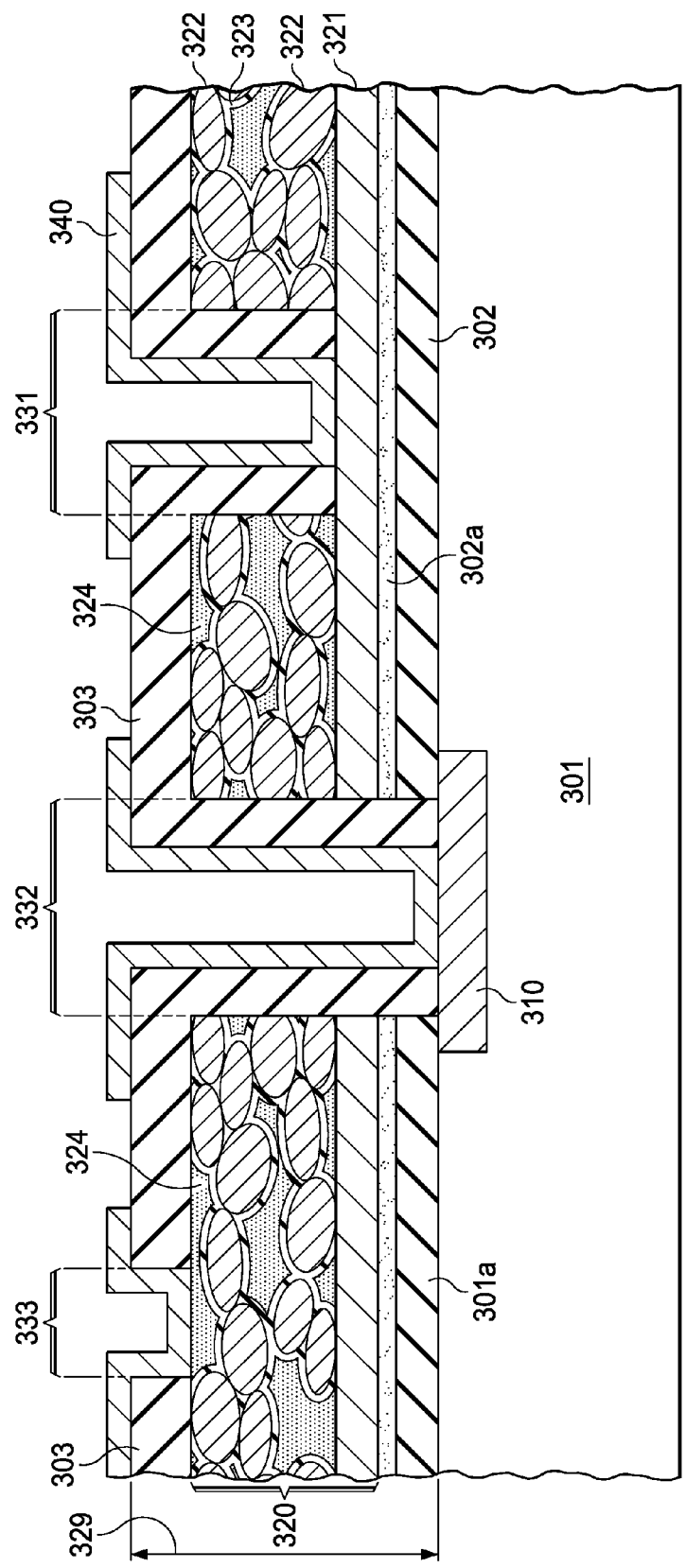
FIG. 3 shows a schematic cross section of a portion of a semiconductor wafer with attached high-density capacitive structures and conductive through-polymer vias reaching conductors at three depth levels.

FIG. 3 summarizes the composition and the methodology of integrating the capacitors with the semiconductor body, or generally with the electronic body. In FIG. 3, semiconductor body 301 has a surface 301a with conductive terminal pads 310 of the circuitry inside the semiconductor body. For the example of a DC/DC converter, pads 310 include the terminals displayed in the diagram in FIG. 1 ($V_{IN}$, $V_{OUT}$, Enable, Ground, Mode Selection).

There are a plurality of features, which tie one or more capacitors to the electronic body and physically embed the capacitors into body 301. A FIG. 3 illustrates, there is an insulating first polymeric film 302, which covers the body surface 301a except the terminal pads 310. First film 302 is adhesive; the adhesive character is indicated in FIG. 3 by tacky extra film 302a.

Adhering to first film 302 is a sheet 320 of high-density capacitive elements, which have with first and second capacitor terminals. The first terminal is a metal foil 321 attached to the first polymeric film and the second terminal a conductive polymeric compound 324. The thickness 329 of sheet 320, together with first insulating film 302 and second insulating film 303, is approximately 50 μm.

The sheet of capacitive elements comprises a metal foil 321, which is the first terminal of the capacitor (sometimes referred as the anode). In touch with foil 321 is a porous conglomerate of sintered metal particles 322. The particle surfaces are covered with a dielectric skin 323, which can be created by oxidation of the particle metal or by coating the particles with an insulating material. As FIG. 3 shows, the voids and pores between the dielectric skin-covered sintered metal particles are filled by a conductive polymeric material 324. Conductive polymer 324 forms the sheet side opposite the metal film 321 and serves as second terminal of the capacitor (sometimes referred to as the cathode). Due to a density of approximately 200 μF/cm² or less and a capacitor stability up to 125° C., the sheet is operable as a high-density capacitor with metal film 321 as first terminal, conductive polymer 324 as second terminal, and dielectric skin 323 of the metal particles as insulator.

FIG. 3 illustrates an embodiment wherein capacitor sheet 320 has sets of conductive through-hole vias. The first set holes, generally designated 331, reaches the metal foil 321; the second set holes, generally designated 332, reaches the body terminals pads 310, and the third set holes, generally designated 333, reaches the conductive polymeric compound 324, and potentially partially contacts the sintered metal particles 322. The conductive through-hole vias of the three sets share some common features.

As FIG. 3 shows, an insulating second polymeric film 303 lines the sidewalls of the holes. Polymeric film 303 also planarizes the sheet surface between the holes. The processes for applying film 303 and opening of the through-hole vias are described below. After the process of opening the through-polymer vias in the polymeric film 303, the vias are made conductive by filling the through-polymer vias between the polymeric sidewalls with metal. FIG. 3 includes the process of depositing a layer of seed metal 340 over the sidewalls of the opened holes. In FIG. 3, seed layer 340 is patterned so that it covers only narrow areas surrounding each hole. It should be noted that the shape of actual through-polymer vias may deviate from the cylindrical shape with vertical sidewalls depicted in FIG. 3; for example, the hole sidewalls may have conical shape.

Figure 4A:
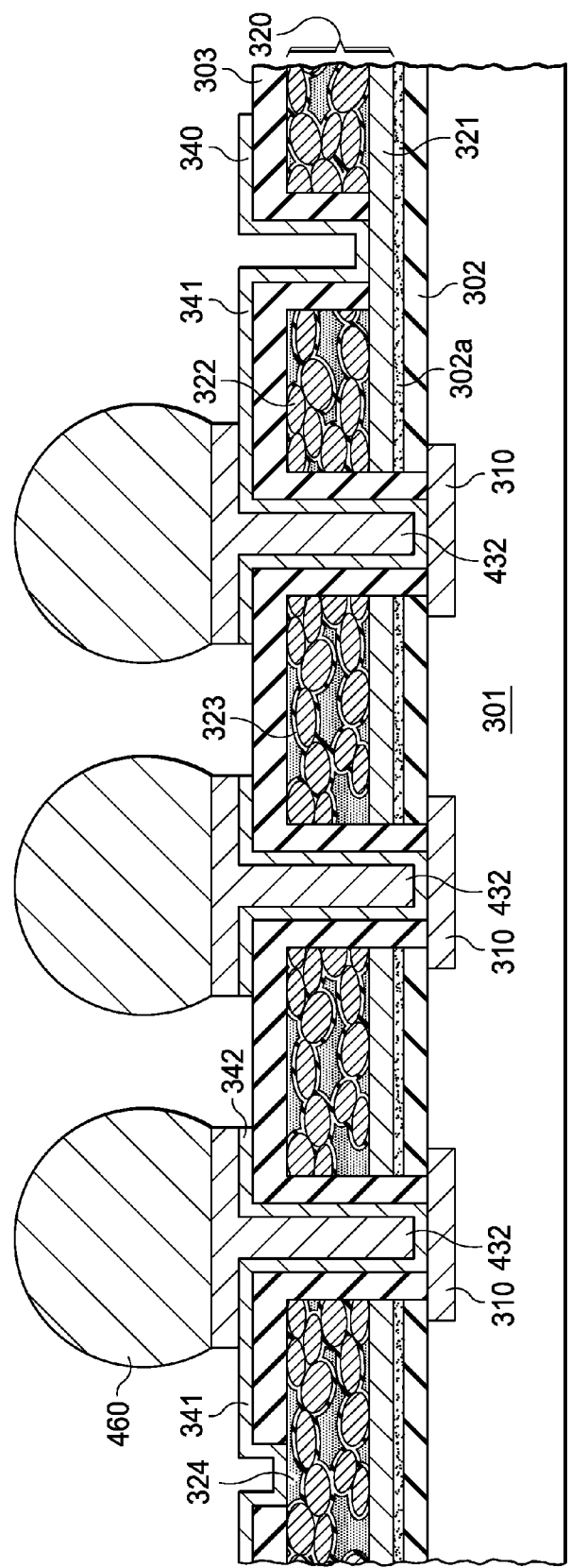
FIG. 4A illustrates a cross section of a portion of an exemplary embodiment, a semiconductor body integral with high-density capacitive structures and conductive through-polymer vias connecting body terminal pads to surface contact pads having solder ball connectors.

In the embodiments of FIGS. 4A and 4B, seed layer 340 has been patterned so that the patterning allows the formation of redistribution traces 341 and attachment pads 342 on the surface of first insulator film 303. FIGS. 4A and 4B includes a plurality of conductive through-polymer vias (of set 332) reaching terminals pads 310 of body 301. For these vias, metal 432 has been plated (about 3 µm thick) onto the patterned seed layer to fill the through-polymer vias and thicken the attachment pads 342. The preferred plated metal 432 is copper. In FIG. 4A, solder balls 460 are attached to the thickened pads. In FIG. 4B, wire ball bonds 461 are attached to the thickened pads.

As FIGS. 4A and 4B show, some redistribution traces 341 connect from a through-polymer via reaching a body terminal to a conductive through-polymer via reaching metal foil 302, the first terminal (anode) of the capacitor. Other redistribution traces 341 connect from a through-polymer via reaching another body terminal to a conductive through-polymer via reaching the conductive polymeric compound 324, the second terminal (cathode) of the capacitor.

Another embodiment of the invention is a method for batch fabricating electronic systems, such as power supply systems, which are integrated with embedded capacitors. As depicted in FIG. 5A, the method starts by providing a semiconductor wafer 501 with embedded electronic bodies, such as integrated circuits, power blocks, or power stages. Integrated in the wafer surface are conductive contact pads of the electronic bodies.

Figure 5B:
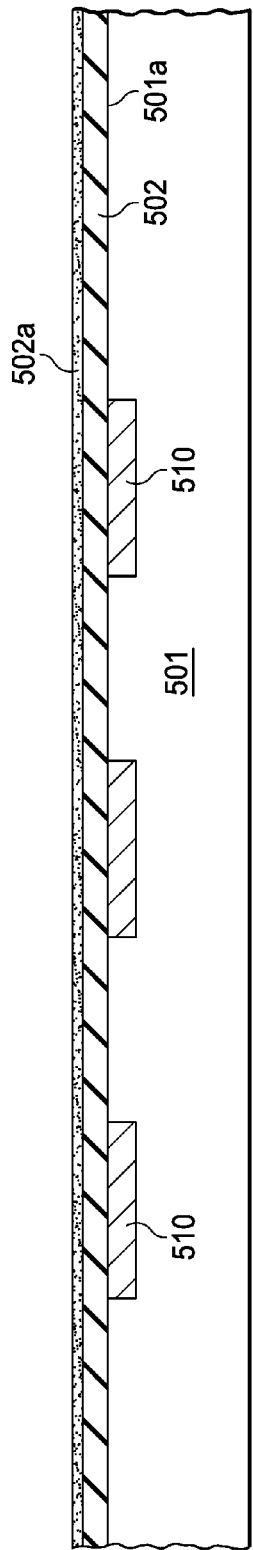
FIG. 5B illustrates the process of laminating an insulating and adhesive first polymeric film across the wafer surface.

In the next process, depicted in FIG. 5B, an insulating first polymeric film 502 is laminated across the wafer surface 501a. A preferred material is an epoxy-based polymer with a filler and high modulus. First polymeric film 502 is adhesive; the adhesive property is indicated in FIG. 5B by tacky extra film 502a.

Figure 5C:
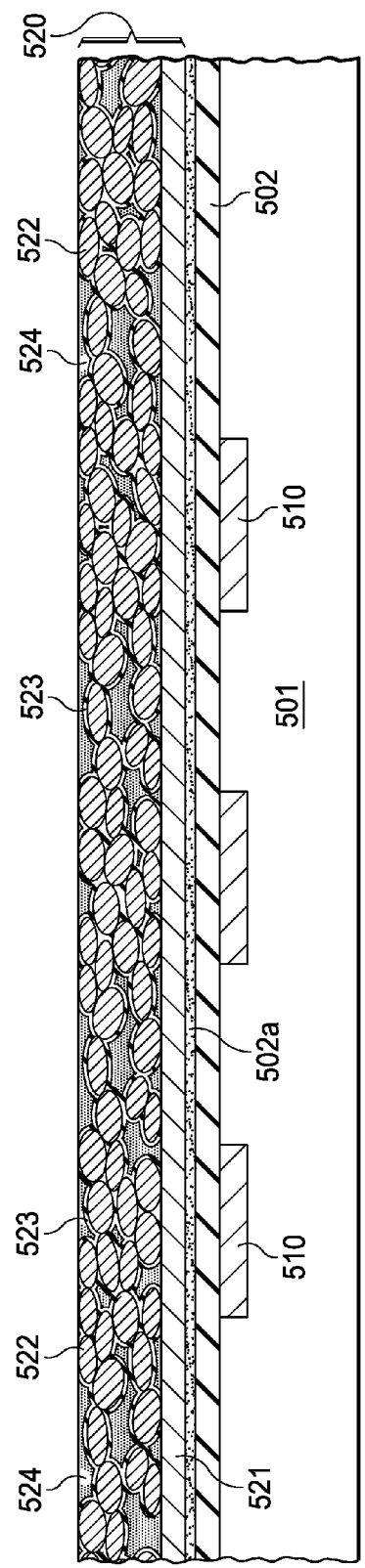
FIG. 5C shows the process of attaching a sheet of high density capacitive elements to the first polymeric film.

FIGS. 5C illustrates the next processes. A sheet 520 of high density capacitive elements is provided. One side of sheet 520 is formed as a foil 521 of a metal such as tantalum or a metal readily forming uniform and stable oxides. Foil 521 is in touch with a porous conglomerate of sintered particles 522 of the same metal; as an example, the sintered particles may be tantalum particles. The particle surfaces are covered with a dielectric skin 523, which may be formed as an oxide of the metal such as tantalum. Alternatively, the skin may be a thin layer of a temperature-stable insulating material. The opposite side of sheet 520 is formed by a conductive polymeric material 524, which is dispensed to fill the pores and voids between the particles. Sheet 520 is operable as a capacitor, which has metal 521 as its first terminal, the conductive polymer 524 as its second terminal, and the dielectric skin 523 of the metal particles as the insulator between the terminals. More detail of the methods for high-density capacitor sheet 520 is described in U.S. Pat. No. 8,084,841 B2, issued on Dec. 27, 2011 (Pulugurtha et al, "Systems and Methods for Providing High-Density Capacitors"); an U.S. Pat. No. 8,174,017 B2, issued on May 8, 2012 (Pulugurtha et al., "Integrating Three-Dimensional High Capacitance Density Structures").

As shown in FIG. 5C, sheet 520 is attached by its metal foil 521 onto the adhesive first polymeric film 502.

Figure 5D:
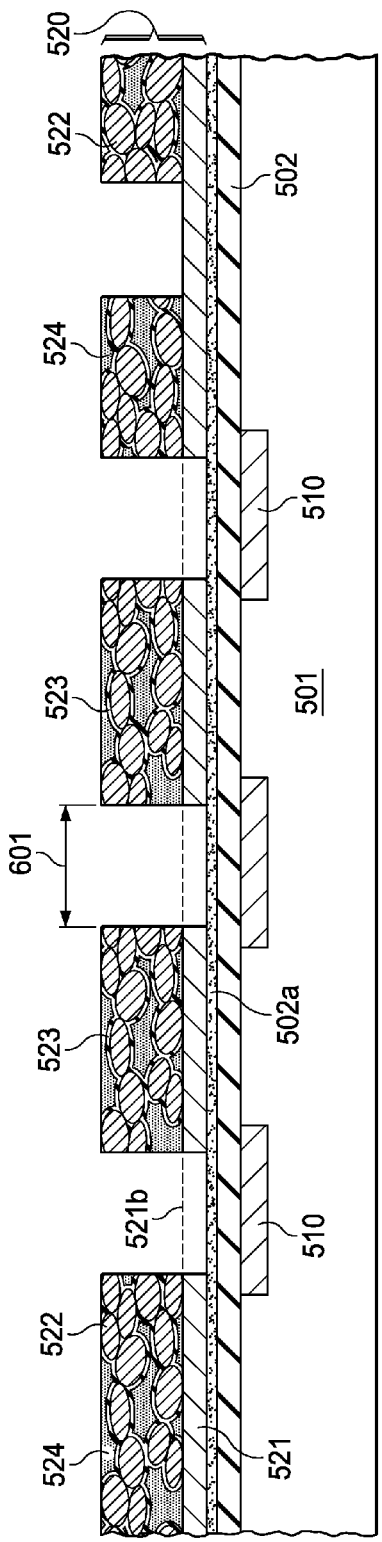
FIG. 5D depicts the process of attaching a metal foil carrying a plurality of pre-defined high density capacitive elements to the first polymeric film.

FIG. 5D depicts an alternative process for providing high density capacitive elements. In FIG. 5D, the metallic foil 521a carries the attached porous conglomerates of sintered particles as discrete pre-etched elements rather than as continuous layer as in FIG. 5C. The discrete elements are separated by via-holes of a first diameter 601 (the same diameter as produced by the process of FIG. 6A), while outside the via-holes the foil surrounding the elements remains as supportive carrier—indicated by the dashed line 521b. As shown in FIG. 5D, sheet 5ao is attached by its metal foil 521a onto the adhesive first polymeric film 502.

Figure 6A:
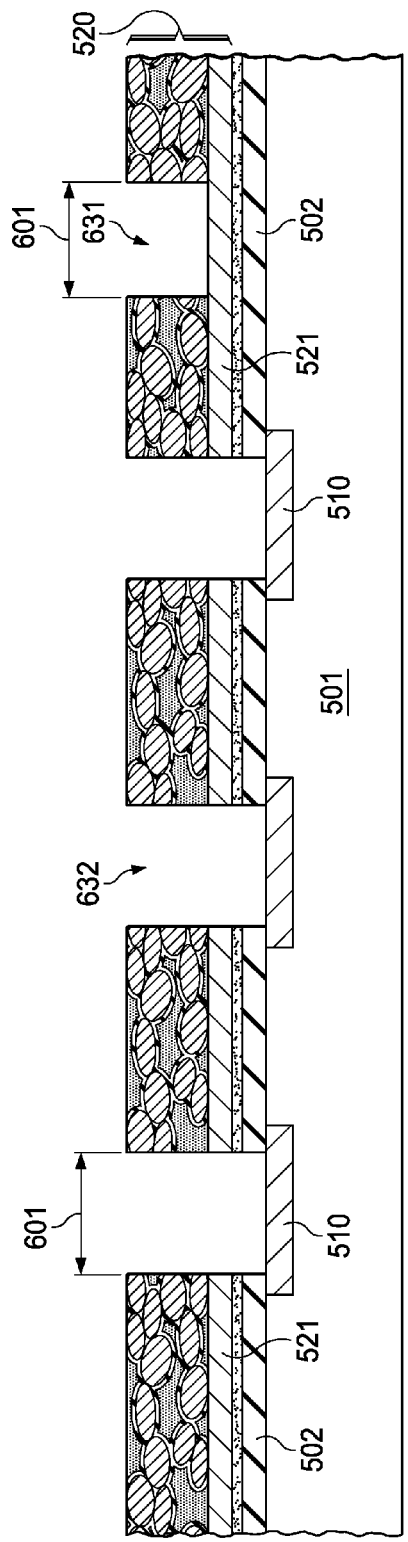
FIG. 6A depicts the processes of opening sets of via-holes of a first diameter in the sheet of FIG. 5C.

FIG. 6A illustrates the process of opening a set of via-holes of a first diameter 601 into sheet 520. Holes 631 of the first set are reaching the metal foil 521, and holes 632 of the second set are reaching the wafer contact pads 510. A preferred method for drilling the openings is a UV laser.

Figure 6B:
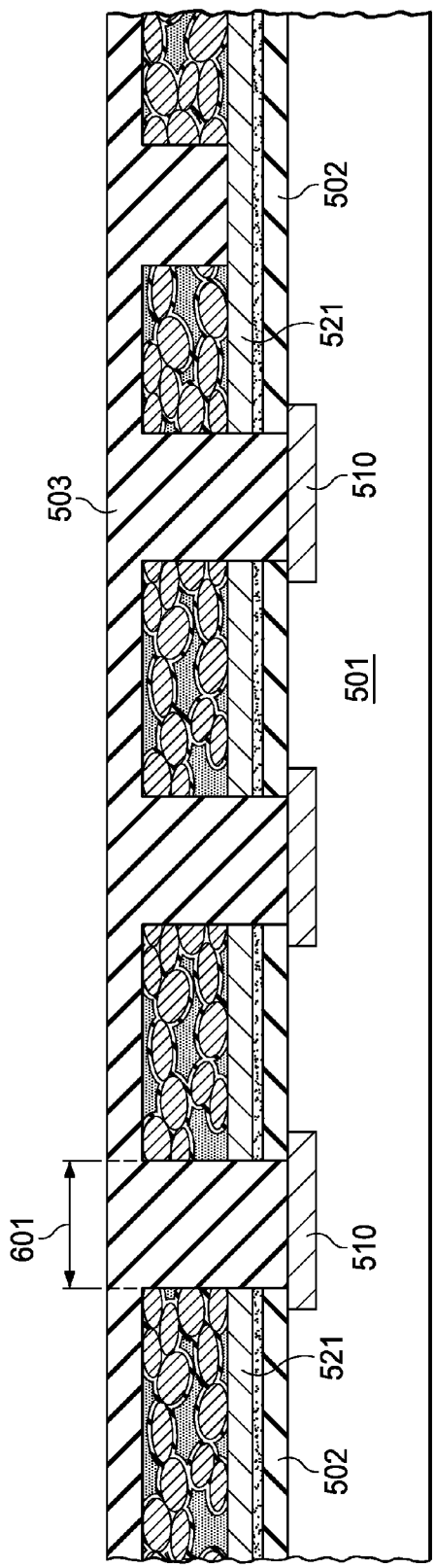
FIG. 6B illustrates the process of laminating an insulating second polymeric film to fill the via-holes of first diameter and to planarize the surface of the sheet of FIG. 6A.

In the next process, depicted in FIG. 6B, an insulating second polymeric film 503 is laminated across the wafer so that the polymeric material fills the via-holes of the first diameter 601 and planarizes the sheet surface.

Figure 6C:
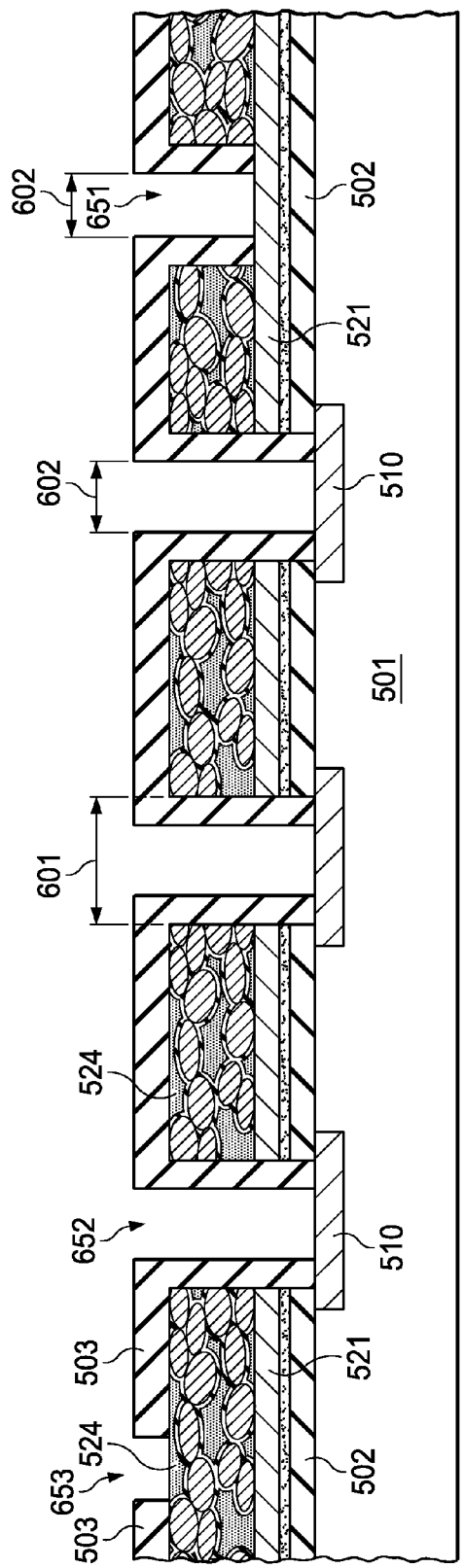
FIG. 6C shows the process of opening sets of through-polymer vias of a second diameter in the second polymeric film of FIG. 6B.

After curing the polymeric material, the next process, shown in FIG. 6C, opens sets of through-polymer via holes of a second diameter 602 into the second polymeric film 503. The second diameter 602 is smaller than the first diameter 601, and the sidewalls of these via holes are composed of the insulating second polymeric material. To the third set belong the holes 651, which are nested inside the first set holes 631; holes 651 reach the metal foil 521. To the fourth set belong the holes 652, which are nested inside the second set holes 632; holes 652 reach a contact pad 510. To the fifth set belong holes 653, which reach the conductive polymeric surface 524. A preferred method for drilling the holes is a UV laser.

Figure 6D:
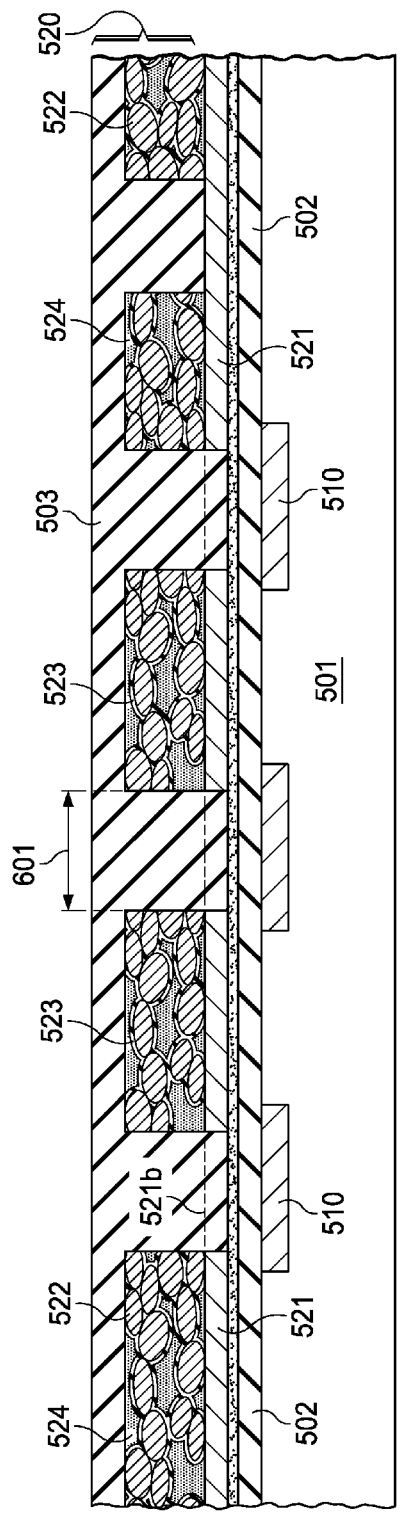
FIG. 6D depicts the process of laminating an insulating second polymeric film to fill the via-holes of first diameter and to planarize the surface of the sheet of FIG. 5D.
Figure 6E:
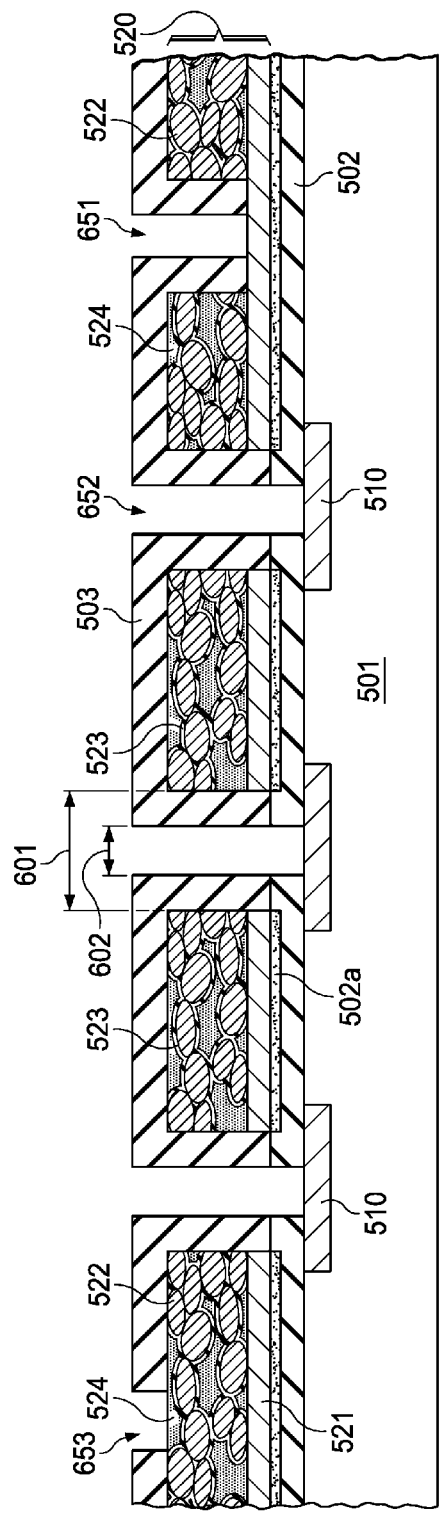
FIG. 6E illustrates the process of opening sets of through-polymer vias of a second diameter in the second polymeric film of FIG. 6D.

In FIG. 6D, the above processes are modified for adapting them to the discrete pre-etched elements of porous conglomerates of sintered particles. As illustrated in FIG. 6D, in a process analogous to the process of FIG. 6B, an insulating second polymeric film 503 is laminated across the wafer so that the polymeric material fills the via-holes of the first diameter 601 and planarizes the sheet surface. After curing the polymeric material, the process of FIG. 6E (analogous to the process of FIG. 6C) opens sets of through-polymer via holes of a second diameter 602 into the second polymeric film 503, as well as into the first polymeric film 502. The second diameter 602 is smaller than the first diameter 601, and the sidewalls of these via holes are composed mostly of the insulating second polymeric material, and partially also of the first polymeric material. To the third set belong the holes 651, which are nested inside the first set holes 631; holes 651 reach the metal foil 521. To the fourth set belong the holes 652, which are nested inside the second set holes 632; holes 652 reach a contact pad 510. To the fifth set belong holes 653, which reach the conductive polymeric surface 524. A preferred method for drilling the holes is a UV laser.

Figure 7A:
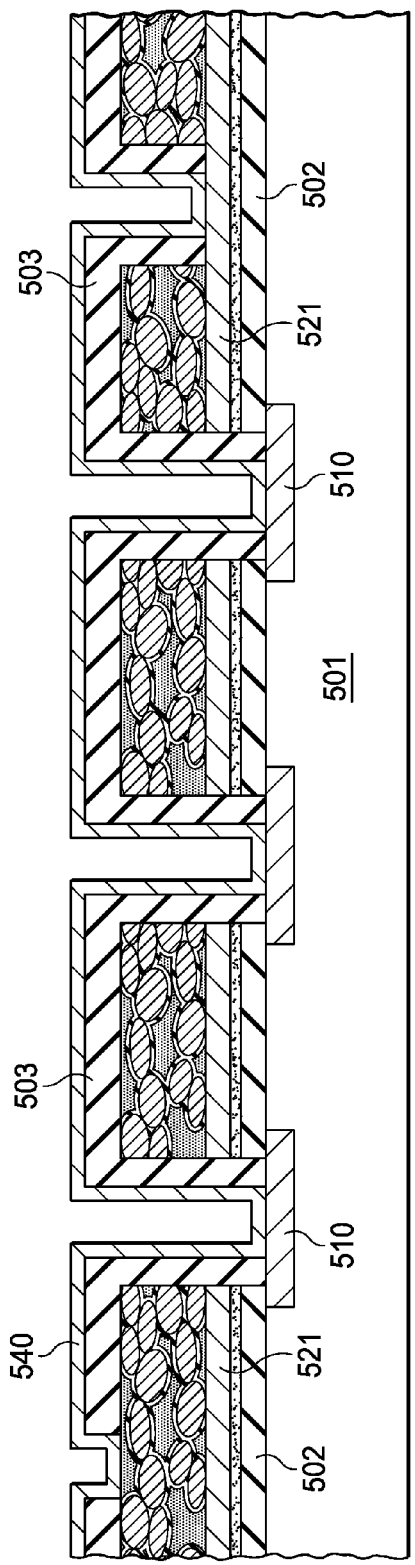
FIG. 7A depicts the process of depositing a metal seed layer across the surface.
Figure 7B:
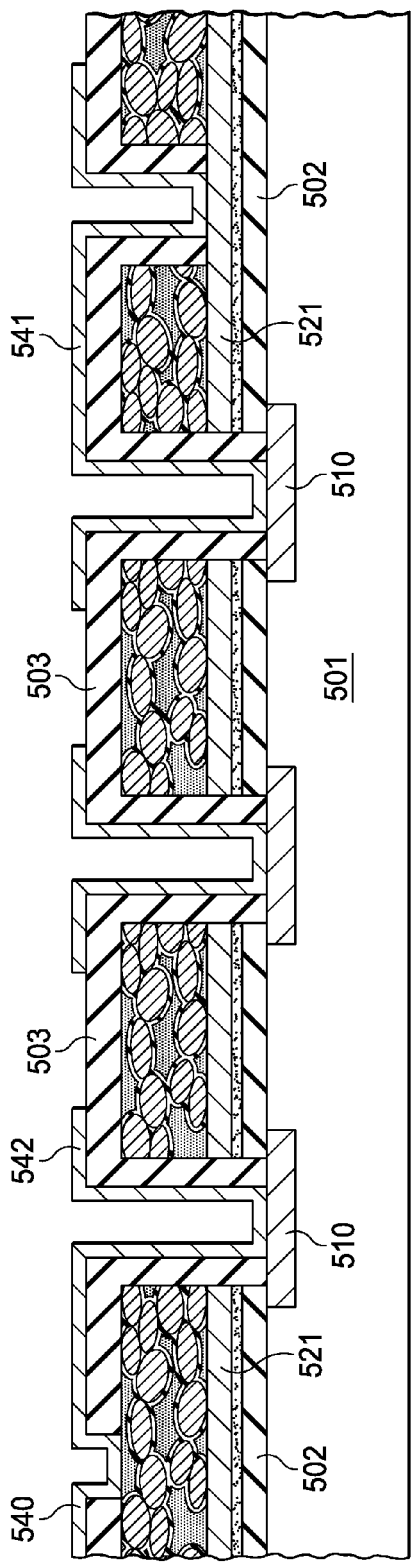
FIG. 7B illustrates the process of patterning the metal seed layer.

In the next processes, the through-polymer vias are metallized. FIG. 7A shows the preferred process of depositing a metal seed layer 540 onto the sidewalls and bottoms of the through-polymer vias and the surface of the second polymeric film 503; the preferred technology is electroless plating. An alternative technology involves sputtering. The preferred metal is a refractory metal such as titanium or tungsten, which adheres well to polymeric compounds. FIG. 7B illustrates the process of patterning seed metal layer 540 in order to create redistribution traces 541 and attachment pads on the surface of the second polymeric film 503.

Figure 7C:
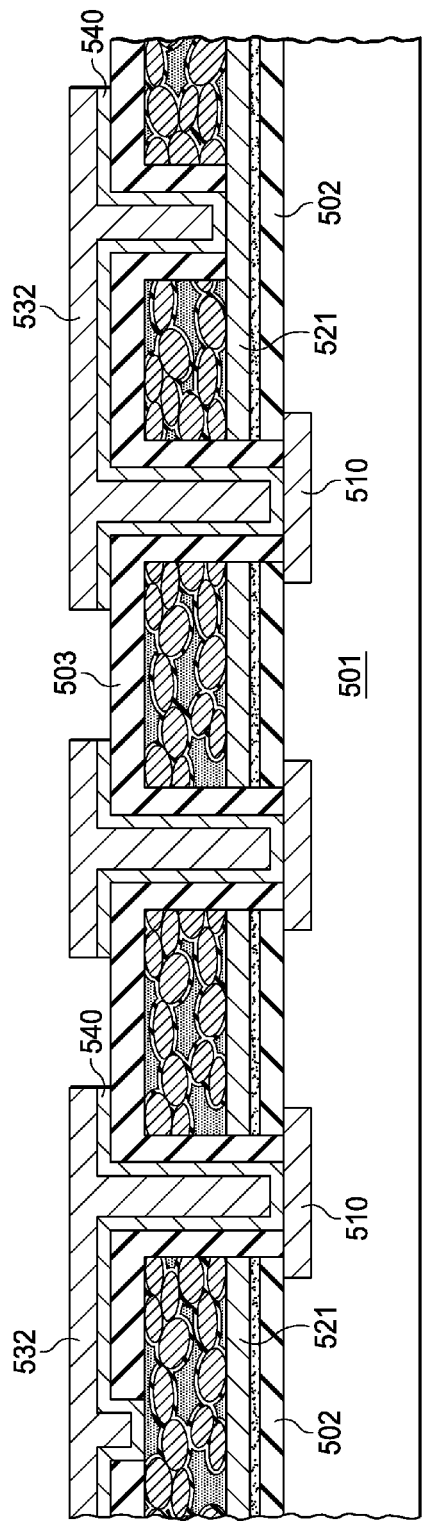
FIG. 7C shows the process of plating metal on the patterned seed layer to fill the through-polymer vias and thicken to attachment pads and redistribution traces.

In the process depicted in FIG. 7C, a relatively thick layer 532 of metal such as copper is plated onto the patterned seed layer to fill the through-polymer vias and thicken the attachment pads and redistribution traces. A preferred thickness of the redistribution traces is about 3 µm.

In yet another process, the deposition of the relatively thick metal layer is following right after the deposition of the seed metal layer, while the process of patterning is applied concurrently to the thick metal layer and the seed metal layer.

In an alternative process, the deposition of the metallic seed layer may be replaced by activating the sidewall surfaces of the polymeric materials before the 3 µm thick copper layer is deposited by electroless plating.

Additional processes involve the attachment of solder balls or wire ball bonds, as shown for example in FIGS. 4A and 4B, and further the step of singulating the semiconductor wafer into discrete units. Each unit includes a system of one or more active semiconductor chips embedded with one or more capacitors composed of high density capacitive elements, and a plurality of attachment pads for external components.

Figure 8:
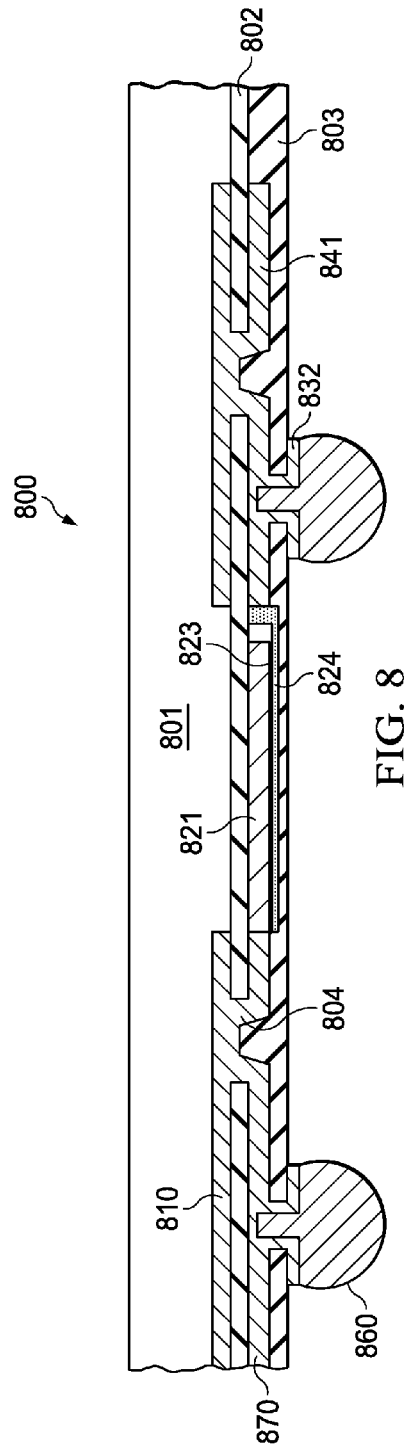
FIG. 8 illustrates the cross section of a portion of another embodiment.

Following the processes in the sequence described above for implementing high-density capacitive structures with conductive through-polymer vias into semiconductor chips, and simplifying in the drawings the capacitor structure into uniform layers for the first and second terminals and the intermediate insulator, a portion of an exemplary embodiment with solder balls can be represented as shown in FIG. 8. In the embodiment 800 of FIG. 8, the high-density capacitive structures are embedded in the redistribution layers on the surface of the semiconductor chip. The designations of device 800 correspond to analogous designations in FIG. 4. Semiconductor chip 801 has a surface with conductive terminal pads 810. The levels of parallel first insulating polymeric film 802 and second insulating polymeric film 803 are interconnected by metallic vias 804 and allow an extension into a redistribution layer 841 to a terminal 832 with metallization for attaching a solder ball 860. The length of the redistribution layer between two adjacent terminals 832 is utilized to accommodate the high-density capacitive structure indicated by first terminal (anode, metal) 821, second terminal (cathode, conductive polymer) 824, and insulator layer 823.

Figure 9:
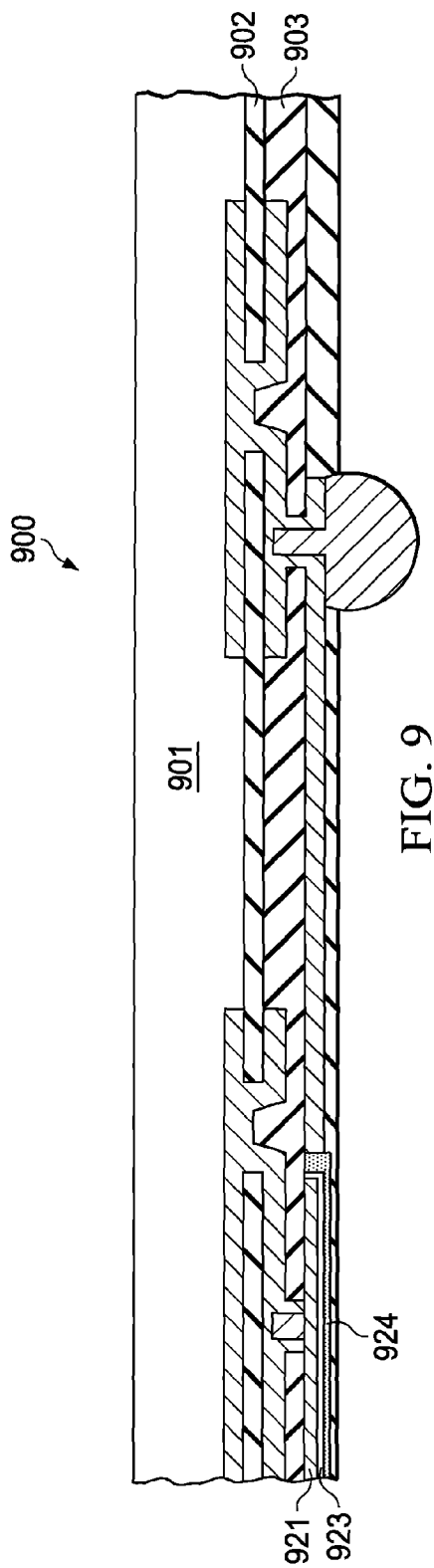
FIG. 9 depicts the cross section of yet another embodiment.

The process flow for fabricating device 800 follows the sequence described above. However, when in another embodiment 900 (see FIG. 9) the high-density capacity structure (first terminal 921, second terminal 924, insulator layer 923) can occupy the place of a depopulated solder ball, it is advisable that the second insulating polymeric film 903 is laminated right after the lamination of the first insulating polymeric film 902, and before the attachment of the sheet of high-density capacitive elements.

Figure 10:
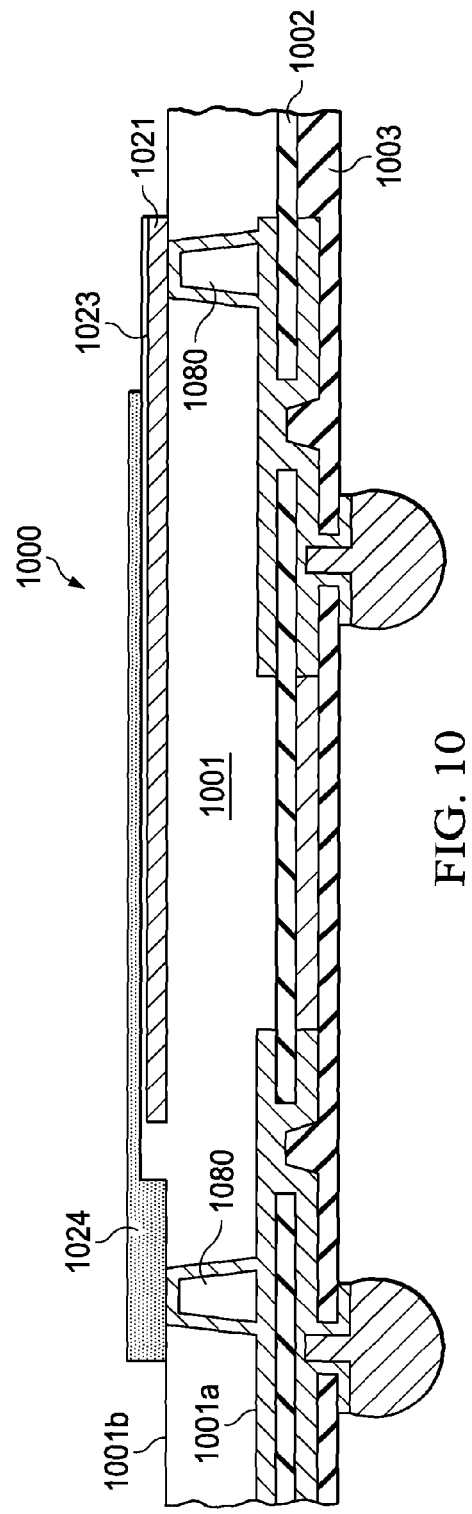
FIG. 10 shows the cross section of a portion of yet another embodiment.

In yet another embodiment, such as device 1000 shown in FIG. 10, semiconductor chip 1001 may have conductive through-silicon vias (TSVs) 1080, which enable contacts to structures on the active chip side 1001a from the opposite and generally passive chip side 1001b. In these cases, it may be helpful for the assembly of systems on boards to place the one or more capacitors on chip side 1001b and connect the capacitor to the structures on chip side 1001a with the help of the TSVs 1080. FIG. 10 shows an elongated capacitor with first terminal 1021, second terminal 1024, and insulator 1023 extended between adjacent TSVs. For the fabrication flow of device 100, it is advisable that the second insulating polymeric film 1003 is laminated right after the lamination of the first insulating polymeric film 1002, and before the attachment of the sheet of high-density capacitive elements.

As FIG. 4B indicates, high density capacitors can be embedded in semiconductor chips, which use wire ball bonding on top of the embedded capacitor to connect the chip terminals to substrates such as metallic leadframes. Due to the bonding wires, such electronic bodies need to be encapsulated in protective packages.

In addition to the exemplary power systems with DC/DC converters as the electronic bodies described above, the embedding of high density capacitors according to the invention can be applied to flyback converters, DC/DC boost converters and isolated converters, charge pumps, fuel gauges, power stages with drivers and load switches, voltage references, current references, current sensors, and generally any electronic systems using capacitors.

It should be stressed that the conductive through-polymer vias, which enable the embedding of the capacitive structures in semiconductor chips, are free of thermomechanical stresses due to differences in CTE (coefficients of thermal expansion). This absence of stress sensitivity is a significant technical advantage of the invention compared to the conventional TSVs (through-silicon vias) 1080 illustrated in FIG. 10, which are known to be plagued by thermomechanical stress problems.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to a chip with integrated circuits, but also to devices with any type of semiconductor chip. For instance, the capacitor sheet may be attached to the surface of a chip, which is assembled on a leadframe pad, wire bonded to leads, and encapsulated in a protective packaging compound.

As another example, the method can be extended to capacitors embedded in an arbitrary number of semiconductor chips integrated into a system. The capacitors may be embedded inside the system or on either surface of the system.

As another example, the capacitance value of capacitors may be modified by varying the process of creating the porous structure, thus allowing to use the same geometrical capacitor values yet with different capacitance values—an inexpensive way of using available package structures with different electrical values.

In yet another example, the metals, insulators, geometries and thicknesses of the capacitors can be selected as a function of the size of the chip so that specific product goals of the assembled package can be achieved such as final thickness, mechanical strength, minimum warpage, prevention of cracking, compatibility with pick-and-place machines, and minimum electrical parasitics.

In yet another example, the high-density capacitive elements can be adjusted and positioned so that electrical characteristics such as operational frequency and frequency stability can be optimized.

In yet another example, the properties of the capacitive structures may have unique sensitivity to physical parameters such as stress, moisture, pressure, irradiation, chemical exposure, or others which may be discovered so that the electrical properties of the capacitive structures can be measured and the structures can be used as a sensor.

It is therefore intended that the appended claims encompass any such modifications or embodiments.

We claim:

1. A method for fabricating an electronic system comprising:
    providing a semiconductor wafer having embedded electronic bodies, the wafer surface having conductive contact pads of the electronic bodies;
    laminating an insulating first polymeric film across the wafer surface;
    providing a sheet of capacitive elements, one sheet side formed as a metal foil in touch with metal particles, surfaces of the metal particles covered with a dielectric skin, and the opposite sheet side formed by a conductive polymeric material between the metal particles, the sheet operable as a capacitor having the metal as first terminal, the conductive polymer as second terminal, and the dielectric skin of the metal particles as insulator;
    attaching the sheet by its metal foil onto the first polymeric film;
    opening sets of via-holes of a first diameter into the sheet, the first set holes reaching the metal foil, and the second set holes reaching the wafer contact pads;
    laminating an insulating second polymeric film across the wafer, filling the via-holes of the first diameter and planarizing the sheet surface;
    opening sets of through-polymer vias of a second diameter into the second polymeric film, the second diameter being smaller than the first diameter, the third set holes, nested inside the first set holes, reaching the metal foil, the fourth set holes, nested inside the second set holes, reaching a contact pad, and a fifth set holes reaching the conductive polymeric surface;
    depositing a metal seed layer onto sidewalls and bottoms of the through-polymer vias and the surface of the second polymeric film, creating redistribution traces and attachment pads on the surface; and
    plating metal onto the patterned seed layer to fill the through-polymer vias.

2. The method of claim 1 further including the process of concurrently curing the first and second polymeric materials.

3. The method of claim 1 further including the process of singulating the wafer into discrete units, each unit including a system of one or more active semiconductor chips embedded with one or more capacitors composed of high density capacitive elements, and a plurality of attachment pads for external components.

4. The method of claim 1, wherein the electronic bodies are selected from a group including power supply systems having a DC/DC converter including a synchronous Buck converter, flyback converters, DC/DC boost converters, isolated converters, charge pumps, fuel gauges, power stages with drivers and load switches, voltage references, current references, and current sensors.

5. The method of claim 1, wherein the dielectric skin is coherent and free of voids.

6. The method of claim 5, wherein the dielectric skin is an insulating metal oxide layer.

7. The method of claim 3, wherein the external components include an inductor.

8. The method of claim 1, wherein the metal foil is suitable to oxidize uniformly and adhere to polymeric compounds.

9. The method of claim 1 wherein, the sets of via holes has a cylindrical shape.

10. The method of claim 1 wherein, the sets of via holes has a conical shape.

11. The method of claim 1 wherein, the capacitor has a thickness of at least 50 μm.

12. The method of claim 2, wherein the metal particles have a capacitive density of approximately equal to or less than 200 μF/cm$^2$.

13. The method of claim 2, wherein the metal particles have a capacitor stability of up to 125° C.

* * * * *